United States Patent
Garrec et al.

(10) Patent No.: US 10,879,846 B2
(45) Date of Patent: Dec. 29, 2020

(54) DEVICE FOR MODULATING A MICROWAVE SIGNAL, TRANSPONDER INCLUDING SUCH A DEVICE, AND RESPONDER BEACON EQUIPPED WITH SUCH A TRANSPONDER

(71) Applicant: THALES, Courbevoie (FR)

(72) Inventors: Patrick Garrec, Merignac (FR); Thibaut Despoisse, Merignac (FR); Anthony Ghiotto, Talence (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/486,284

(22) PCT Filed: Feb. 28, 2018

(86) PCT No.: PCT/EP2018/054855
§ 371 (c)(1),
(2) Date: Aug. 15, 2019

(87) PCT Pub. No.: WO2018/166790
PCT Pub. Date: Sep. 20, 2018

(65) Prior Publication Data
US 2020/0235704 A1    Jul. 23, 2020

(30) Foreign Application Priority Data

Mar. 14, 2017    (FR) .................................... 17 00264

(51) Int. Cl.
*H03C 5/02*    (2006.01)
*G01S 1/22*    (2006.01)
*H04B 14/00*    (2006.01)

(52) U.S. Cl.
CPC .................. *H03C 5/02* (2013.01); *G01S 1/22* (2013.01); *H04B 14/004* (2013.01)

(58) Field of Classification Search
CPC .......... H03C 5/00; H03C 5/02; H04B 14/004; G01S 13/82; G01S 13/756
See application file for complete search history.

(56) References Cited

U.S. PATENT DOCUMENTS 8,073,407 B2 * 12/2011 Fukuda ................ H04B 1/1607
455/114.1

FOREIGN PATENT DOCUMENTS

| FR | 3 002 098 A1 | 8/2014 |
| WO | 92/14307 A1 | 8/1992 |
| WO | 01/29574 A1 | 4/2001 |
| WO | 2012/151056 A1 | 11/2012 |

* cited by examiner

*Primary Examiner* — Jeffrey M Shin
(74) *Attorney, Agent, or Firm* — BakerHostetler

(57) ABSTRACT

The modulation includes in amplifying the microwave signal phase shifted by a given angle into a first sinusoidal signal, in order to obtain a first amplified signal; and in amplifying the microwave signal phase shifted by the given angle increased by π into a second sinusoidal signal phase shifted by π with respect to the first signal, in order to obtain a second amplified signal phase shifted by π with respect to the first amplified signal; the modulated microwave signal being the sum of the first amplified signal and the second amplified signal.

15 Claims, 8 Drawing Sheets

DEVICE FOR MODULATING A MICROWAVE SIGNAL, TRANSPONDER INCLUDING SUCH A DEVICE, AND RESPONDER BEACON EQUIPPED WITH SUCH A TRANSPONDER

CROSS-REFERENCE TO RELATED APPLICATIONS

This application is a National Stage of International patent application PCT/EP2018/054855, filed on Feb. 28, 2018, which claims priority to foreign French patent application No. FR 1700264, filed on Mar. 14, 2017, the disclosures of which are incorporated by reference in their entirety.

FIELD OF THE INVENTION

The present invention relates to a device for modulating a microwave signal, to a transponder comprising such a device and to a responder beacon equipped with such a transponder. The field of the invention is in particular that of the localization of targets, whether moving or stationary, by means of responder beacons.

BACKGROUND

For this localization, transponders may be used, for example to detect moving objects or objects of substantially zero speed such as for example, in particular, a helicopter in stationary flight. In this context, one problem to be solved is that of producing low-cost transponders that nonetheless perform well.

To produce transponders, prior-art solutions use nonlinear systems, in particular microwave mixers. They implement amplitude or phase modulations. The transponder thus reemits a received signal with an amplitude modulation or a phase modulation. To this end, a first input of a mixer receives the signal received by the transponder and a second input receives the modulation signal, the modulated signal being obtained at the output of the mixer. This type of modulation by means of mixers generates harmonic lines as a result of non-linear chopping of the signal, as the amplitude modulation described below demonstrates.

Let a signal CW(t) received by the transponder be considered; this signal is continuous, of amplitude A, of frequency $f_1$ and of phase shift $\phi_1$, it has the following form:

$$CW(t) = A \cdot \sin(2\pi f_1 t + \phi_1)$$

The modulation signal m(t) is a square wave of amplitude 1, of frequency $f_2$ and of 50% duty cycle. It is a question of OOK (on-off keying) modulation; this signal is characterized by the equation:

$$m(t) = \text{sign}(\sin(2\pi f_2 t))$$

The result of the modulation, at the output of the mixer, is:

$$s(t) = CW(t) * m(t) = A \cdot \sin(2\pi f_1 t + \phi_1) * \text{sign}(\sin(2\pi f_2 t))$$

The spectra of the signals are CW(t), m(t), respectively:

$$Tf(CW(t)) = \hat{CW}(f) = \frac{A}{2i}(\delta(f - f_1) - \delta(f + f_1))$$

$$Tf(m(t)) =$$

$$\hat{m}(f) = \frac{4}{\pi} \cdot Tf\left(\sin(2\pi.f_2.t) + \frac{1}{3}\sin(3*2\pi.f_2.t) + \frac{1}{5}\sin(5*2\pi.f_2.t) + \ldots\right)$$

Tf being the Fourier transform and δ being the Dirac function.

The spectrum of s(t) is therefore composed of the carrier and of uneven harmonic lines of decreasing amplitude.

This type of modulation is simple to carry out, but fails to remove the fundamental frequency and its harmonics, and therefore inessential radiation and energy that is needlessly reemitted. It is thus necessary to add narrow-band filters in order to remove these harmonic lines.

By way of example, document WO2012151056 describes a system using mixers and amplitude modulators and therefore filters. Likewise document FR3002098 discloses a transponder that necessarily uses a mixer and filters.

Phase modulation, of PSK type for example, is also simple to implement. In this case, the fundamental frequency is suppressed, but the harmonics remain. The same goes for sinusoidal phase modulations. The harmonics are not suppressed and it is necessary to add very complex filters to do so.

Finally, all these nonlinear systems are complex and expensive to implement, they are bulky and moreover require calibrations.

SUMMARY OF THE INVENTION

One aim of the invention is in particular to produce low-cost transponders that are simple to implement and high-performance. To this end, one subject of the invention is in particular a device for modulating a microwave signal, comprising at least:
  a circuit for generating a rectified sinusoidal signal;
  a phase-shifting circuit able to receive as input said microwave signal comprising:
    a first channel applying a given phase shift;
    a second channel applying said given phase shift increased by π;
  a variable-gain amplifier the gain of which is controlled by said rectified sinusoidal signal;
  a switch controlled by said rectified sinusoidal signal, able to alternatively switch said first channel and said second channel to the input of said amplifier, the switch from one channel to the next being performed on each passage through 0 of said rectified sinusoidal signal, the output signal of said amplifier being the modulated microwave signal.

Said device for example comprises:
  a second circuit for generating a rectified sinusoidal signal;
  a second variable-gain amplifier the gain of which is controlled by said rectified sinusoidal signal generated by said second circuit;
  a second switch controlled by said rectified sinusoidal signal, able to alternatively switch said first channel and said second channel to the input of said second amplifier, the switch from one channel to the next being performed on each passage through 0 of said rectified sinusoidal signal;
  an adder that sums the signal output from said first amplifier and the signal output from said second amplifier;
the signal output from said adder, resulting from the summation of said output signals, being the modulated signal.

A phase-shifter is for example connected between said second switch and said second variable-gain amplifier, said phase-shifter applying a phase shift of +π/2, said modulated signal being single-sideband modulated.

Said given phase shift is for example zero. Said first channel for example connects the input of said phase-shifting circuit to a first input of said switch, said second channel comprising a phase-shifter that applies a phase shift of π and that is connected between said input and a second input of said switch.

Said given phase shift is for example equal to −π/2. In one embodiment:

said first channel comprises a first phase-shifter that applies a phase shift of −π/2 and that is connected between the input of said phase-shifting circuit and a first input of said switch;

said second channel comprises a second phase-shifter that applies a phase shift of +π/2 and that is connected between said input and a second input of said switch.

In another possible embodiment, a device according to the invention comprises at least:

a circuit for generating a first sinusoidal signal and a second sinusoidal signal that is phase shifted by π with respect to said first signal;

a first channel, able to receive as input said microwave frequency signal, comprising a first phase-shifter that applies a given phase shift and a first variable-gain amplifier the gain of which is controlled by said first sinusoidal signal;

a second channel, able to receive as input said microwave frequency signal, comprising a second phase-shifter that applies said given phase shift increased by π and a second variable-gain amplifier the gain of which is controlled by said second sinusoidal signal;

an adder that sums the signal output from said first amplifier and the signal output from said second amplifier;

the signal output from said adder, resulting from the summation of said output signals, being the modulated signal.

Said given phase shift is for example zero or even equal to −π/2.

Said generating circuit for example comprises at least a low-frequency generator that delivers said sinusoidal signal and a circuit containing a differential amplifier that, on the one hand, reproduces said sinusoidal signal in order to form said first sinusoidal signal and that, on the other hand, delivers a sinusoidal signal that is phase-shifted by π with respect to said sinusoidal signal in order to form said second sinusoidal signal.

Another subject of the invention is a transponder comprising at least:

receiving means able to receive a microwave signal;

a modulating device according to one of the embodiments described above, that modulates the signal output from said receiving circuit;

emitting means that are able to emit the modulated signal output from said modulating device.

Said receiving means comprising an antenna composed of an array of radiating elements, said phase shift of π between said first channel and said second channel is for example obtained in the radiating elements between the positive polarity and the negative polarity of each radiating element, the first channel being connected to all of the positive polarities and the second channel being connected to all of the negative polarities.

Yet another subject of the invention is a responder beacon equipped with a transponder such as described above, said rectified sinusoid or said sinusoidal signals for example having a frequency substantially equal to 1 kHz.

BRIEF DESCRIPTION OF THE DRAWINGS

Other features and advantages of the invention will become apparent from the following description, which is given with reference to the appended drawings, which show.

DETAILED DESCRIPTION

A transponder incorporating a modulating device according to the invention is described below. As the described example embodiments will show, the modulation of a microwave signal according to the invention in particular consists:

in amplifying a microwave signal phase shifted by a given angle into the amplitude of a first sinusoidal signal, in order to obtain a first amplified signal; and in amplifying the same microwave signal phase shifted by the given angle increased by π into the amplitude of a second sinusoidal signal, equal to the first signal phase shifted by π, in order to obtain a second amplified signal phase shifted by π with respect to the first amplified signal;

The modulated microwave signal is a combination of the first amplified signal and the second amplified signal.

Two embodiments allowing this modulation to be carried out are described below. The first embodiment uses a variable-gain amplifier to amplify the signals depending on the amplitude of a rectified sinusoid and a switch to reconstruct a function equivalent to the two sinusoids. The second embodiment uses two variable-gain amplifiers, without switch.

Figure 1:
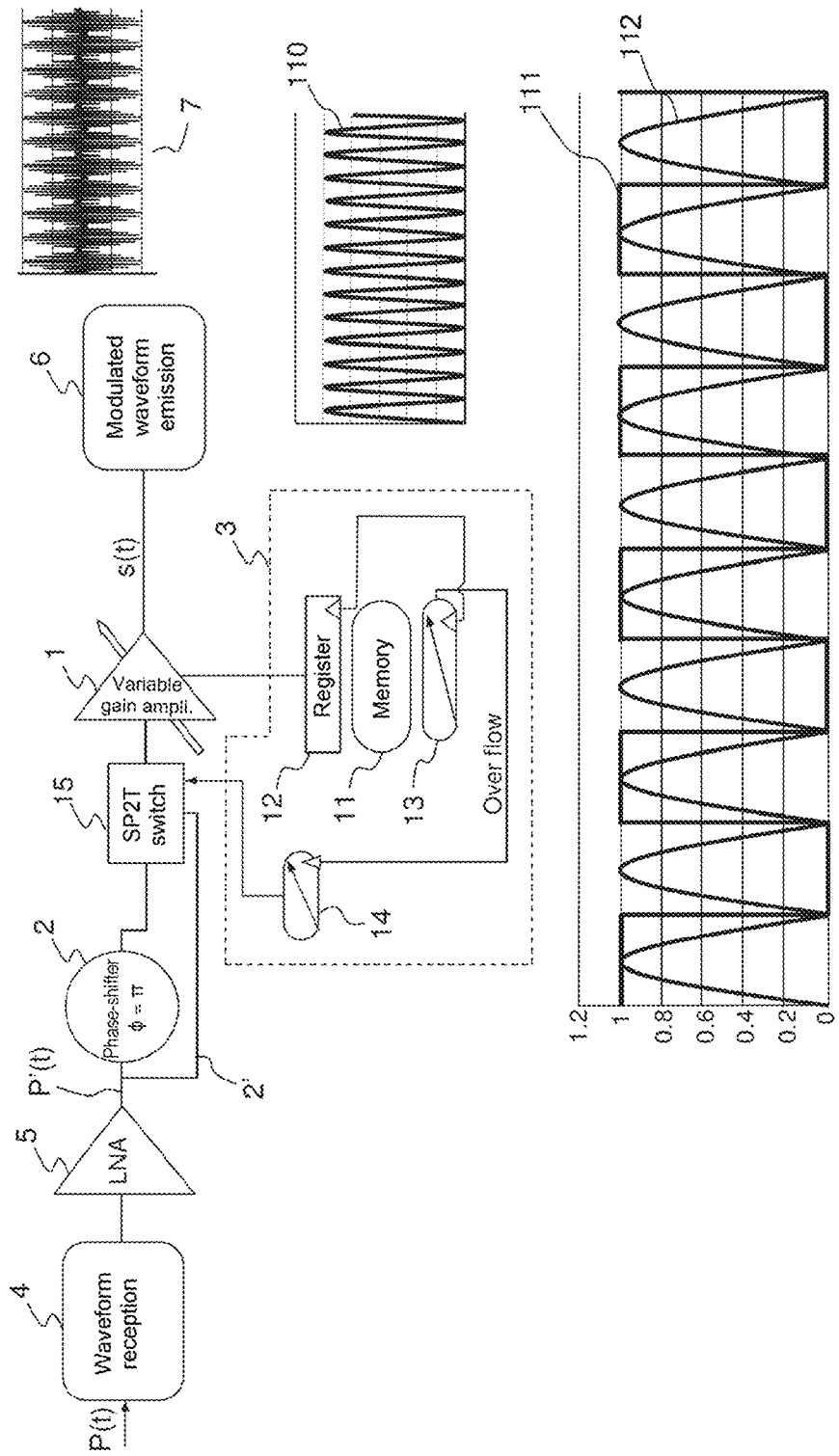
FIG. 1, a first example embodiment of a transponder according to the invention.

FIG. 1 therefore illustrates a first example embodiment of a transponder according to the invention. This transponder advantageously comprises a circuit that carries out a modulation of the received signal.

The received signal P(t) and the modulation M(t) are defined by the following relationships:

Received signal: $P(t)=N \cdot \sin(2\pi \cdot f_1 \cdot t + \varphi)$

Modulation $M(t)=N_1 \cdot \sin(2\pi \cdot f_2 \cdot t + \varphi_1)$

The modulated signal s(t) reemitted by the transponder is, excluding the phase shift:

$$s(t)=P(t) \cdot M(t)=N_1 \cdot \sin(2\pi \cdot f_2 t) \cdot N \cdot \sin(2\pi \cdot f_1 \cdot t) \qquad (1)$$

Of course, the received signal may also be a frequency ramp varying as a function of time.

To implement this multiplication and therefore apply the modulation, the circuit in particular uses a variable-gain amplifier 1, a phase-shifter 2, a switch 15 and a control circuit 3 to generate the base frequency of the modulation $\omega_2 = 2\pi \cdot f_2$.

The transponder for example comprises receiving means 4 that capture the signal P(t). These receiving means are realized in a known way; they comprise at least one receiving antenna and associated circuits that direct the received signal P(t) to the other circuits of the transponder, for example to a low-noise amplifier 5 the output signal of which is denoted P'(t).

The output signal of the amplifier is modulated according to relationship (1) above by means of the variable-gain amplifier 1, of the phase-shifter 2, of the switch 15 and of the control circuit 3. More precisely, a phase-shifting circuit is formed from a first channel comprising the phase-shifter 2, which channel is connected at the output of this phase-shifter to an input of the switch, and from a second channel 2' that is directly connected to another input of the switch. The switch 15 and the amplifier form a circuit that alternatively amplifies a signal output from the first channel and a signal output from the second channel.

The output of the amplifier 1 delivers the modulated signal s(t), the latter being reemitted by emitting means 6. The latter comprise at least one power amplifier and one emitting antenna, the latter possibly also being used in reception.

To produce the function $N_1 \cdot \sin(2\pi \cdot f_1 \cdot t)$, the control circuit comprises a memory 11 in which a rectified sinusoid 110 is stored in sampled form, representing the absolute value of the function $N_1 \cdot \sin(2\pi \omega_1 t)$. The samples of the sinusoid 110 are passed to a register 12 at a rate set by a first counter 13. The value displayed on the register controls the gain of the amplifier 1 so that the gain of the latter follows the rectified sine function 110. The amplitude of the rectified sinusoid 110 is dependent on the dynamic range of the amplifier gain so that the latter amplifies the signal input into it depending on the desired amplitude $N_1$ of the sine function.

To obtain the multiplication of the received signal P(t) by the function $N_1 \cdot \sin(2\pi \cdot f_1 \cdot t)$ (complete sinusoid) at the output of the low-noise amplifier 5, the transponder uses the phase-shifter 2. The latter phase shifts the signal P(t) by $\pi$. In combination with the control circuit, it phase shifts by $\pi$ one half-sinusoid in two of the signal P(t), the signal P(t) not being phase shifted the other half-period (phase shift equal to 0). This 0-$\pi$ phase shift applied to the received signal, in combination with the amplifier gain that follows the function $|N_1 \cdot \sin(2\pi \cdot f_1 \cdot t)|$, leads the received signal to be multiplied by the function $N_1 \cdot \sin(2\pi \cdot f_1 \cdot t)$.

To control this 0-$\pi$ phase shift, the control circuit comprises a second counter 14 that controls the switch 15. This counter 14, which is synchronized with the first counter, counts the duration of the half-sinusoids. On each new half-sinusoid, the second counter 14 switches the switch 15, which is for example an SP2T switch.

This switch comprises:
an input connected to the output of the phase-shifter 2, which therefore lets the signal P(t) phase shifted by $\pi$ pass;
a second input connected directly to the output of the low-noise amplifier 5, and letting the non-phase shifted signal P(t) pass.

The output of the switch is connected to the input of the variable-gain amplifier 1. The input connected to this output is switched at a rate set by the second counter 14, i.e. the input changes on each new half-sinusoid.

FIG. 1 shows, below the control circuit 3, the rectified sinusoid function 112 controlling the gain of the amplifier 1. This rectified sinusoid function 112 is defined by the half-sinusoid 110 stored in memory, and the rotation speed of said half-sinusoid by the first counter 13, which sets its frequency. Applied in combination with the phase shift of $\pi$, it corresponds to the above modulation function M(t).

The same graph also shows the control signal 111 that the second counter 14 generates to control the phase shift. The latter delivers a value 1 and a value 0, each of these values switching one then the other of the inputs of the switch to its output. As a result one then the other channel of the phase-shifting circuit 2, 2' is alternatively switched to the variable-gain amplifier, the switch from one channel to the next being performed on each passage through 0 of said rectified sinusoidal signal.

FIG. 1 shows an example embodiment of the control circuit 3. The latter essentially delivers the absolute value of the modulation, i.e. |M(t)|. Other embodiments may be implemented to perform the same function. The circuit such as shown may be replaced by any other type of programmable or logic circuit, or even by a microcontroller.

Figure 2A:
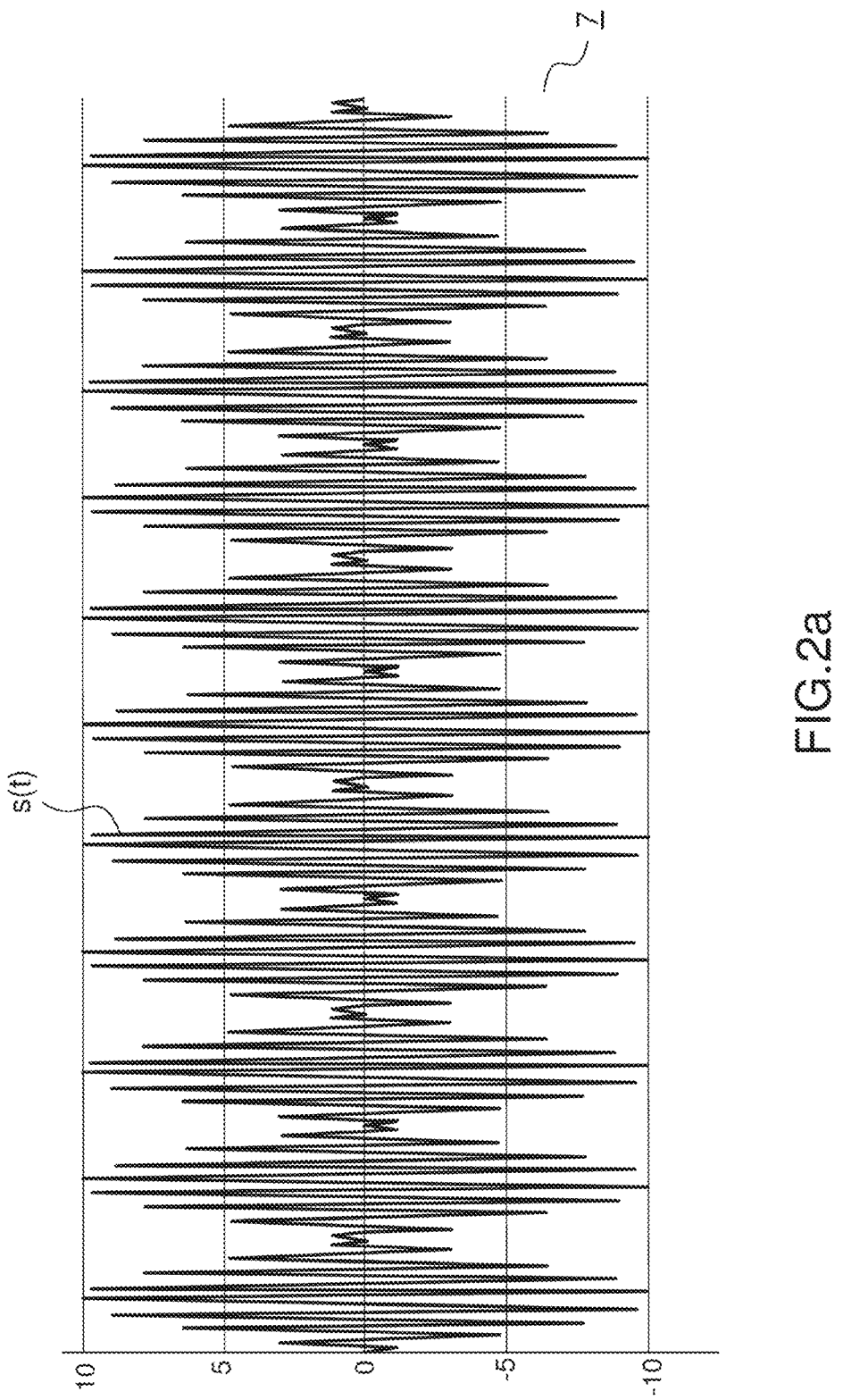
FIGS. 2a and 2b show the form of the reemitted signal output from the transponder and the spectrum of this signal, respectively.
Figure 2B:
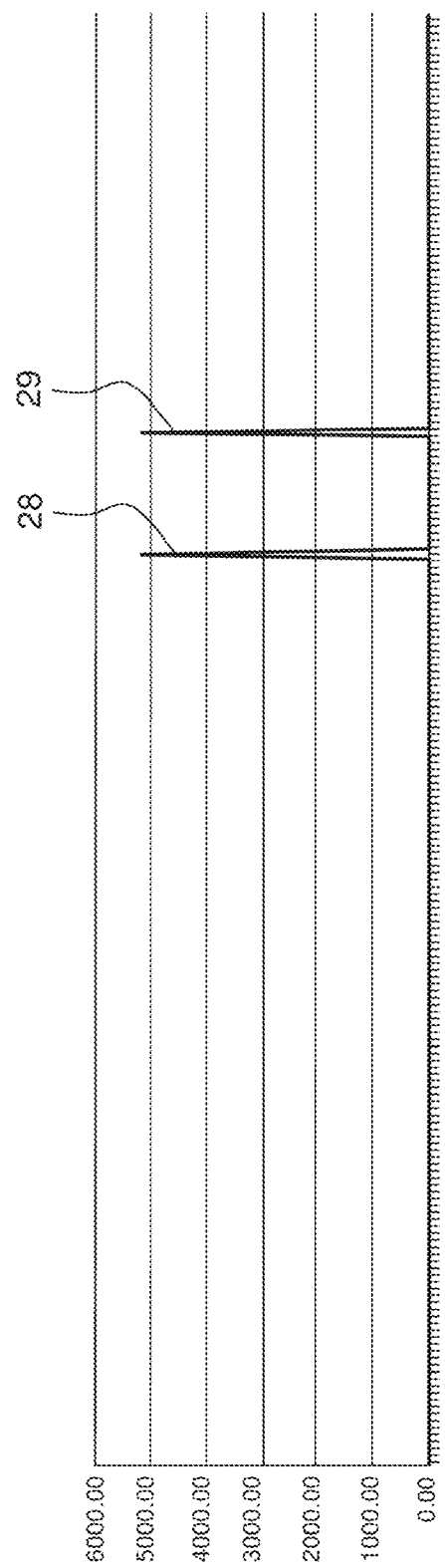

FIGS. 2a and 2b illustrate the signal 7 reemitted by the transponder as output from the emitting means 6 and modulated using the device of FIG. 1, and the spectrum of this signal, respectively.

FIG. 2a clearly shows that the output signal 7 is without carrier, its modulation depending on the modulation frequency $f_1$ applied by the control circuit 3.

The received signal P(t) is modulated at a lower frequency that depends on an envelope defined by the half-sinusoid 112, or rectified sinusoid, of FIG. 1. The modulation frequency $f_1$ is for example substantially equal to 1 kHz.

FIG. 2b shows the two spectral lines 28, 29 of the output signal 7, which lines are representative of the sine function. There are no harmonic lines.

Figure 3:
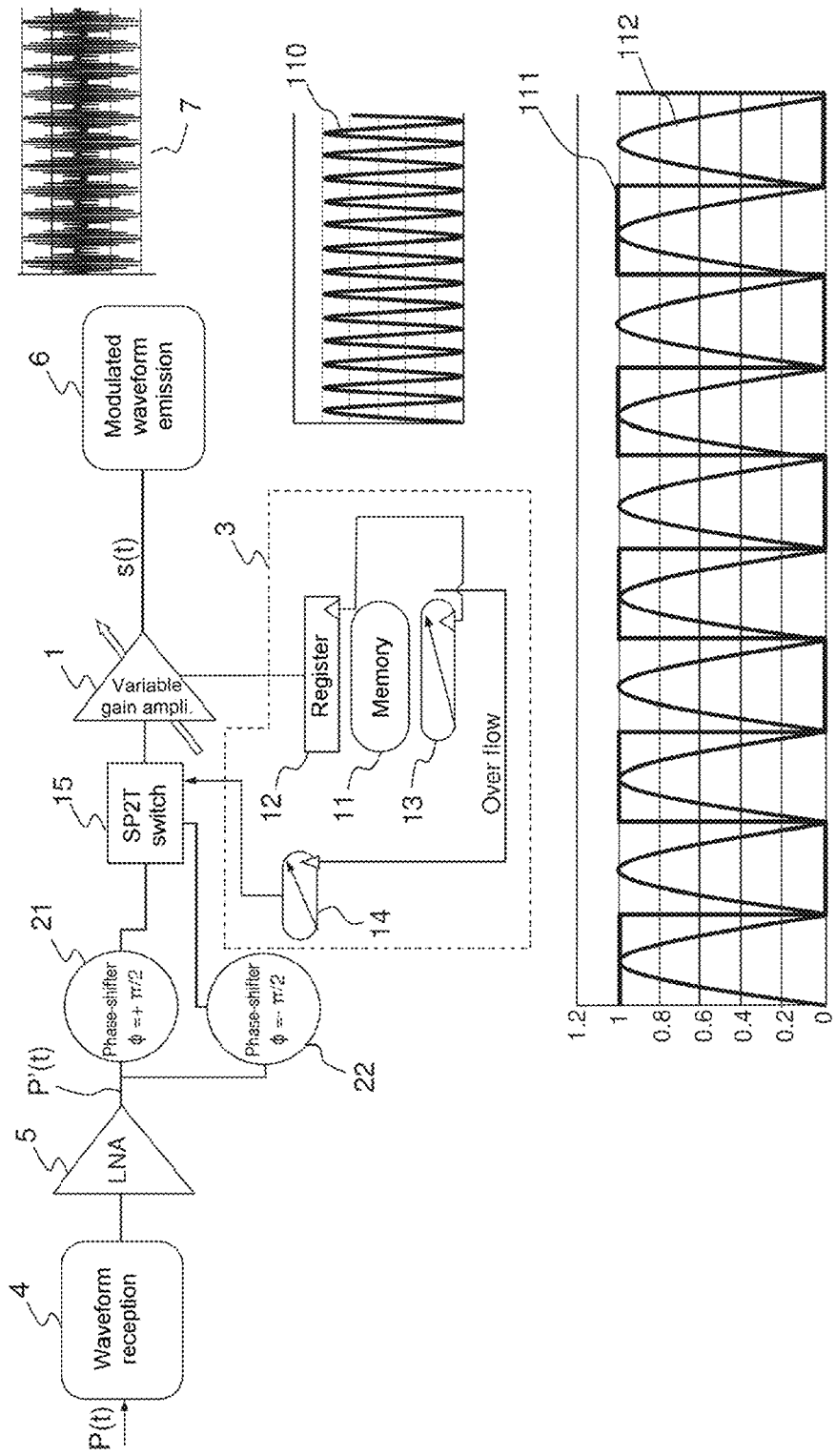
FIG. 3, a second example embodiment of a transponder according to the invention.

FIG. 3 illustrates another example embodiment of a transponder according to the invention in which the $\pi$ phase-shifter is advantageously replaced by two phase-shifters 21, 22, one phase-shifter 21 carrying out a phase shift of +$\pi$/2 on the first channel of the phase-shifting circuit and the other phase-shifter 22 carrying out a phase shift of −$\pi$/2 on the second channel.

These two phase-shifters are therefore inserted between the low-noise amplifier 5 and the switch 15, the output of one phase-shifter being connected to one input of the switch and the output of the other phase-shifter being connected to the other input of the switch. As in the example embodiment of FIG. 1, a phase shift of $\pi$ between two consecutive rectified half-sinusoids is again obtained, functionally reconstructing a complete sinusoid, while benefiting from a better balance of the signals between the two input channels of the switch 15.

Another advantage of the example embodiments of FIGS. 1 and 3 is that they allow the received signals to be processed with a dynamic range that is large both in terms of amplitude and in terms of energy. By way of comparison, when a mixer (non-linear component) is used it is necessary to amplify the signal to reach the non-linear zone of this mixer. This limits the dynamic range of the signals and further requires filters to be added to suppress harmonics. In the case of a modulation with a low frequency, there will be harmonics very close to the carrier of the received signal P(t) and the employment of filters has many disadvantages, in particular in terms of cost, bulk and difficulty of implementation, in particular if reconfigurable filters are to be obtained.

Figure 4:
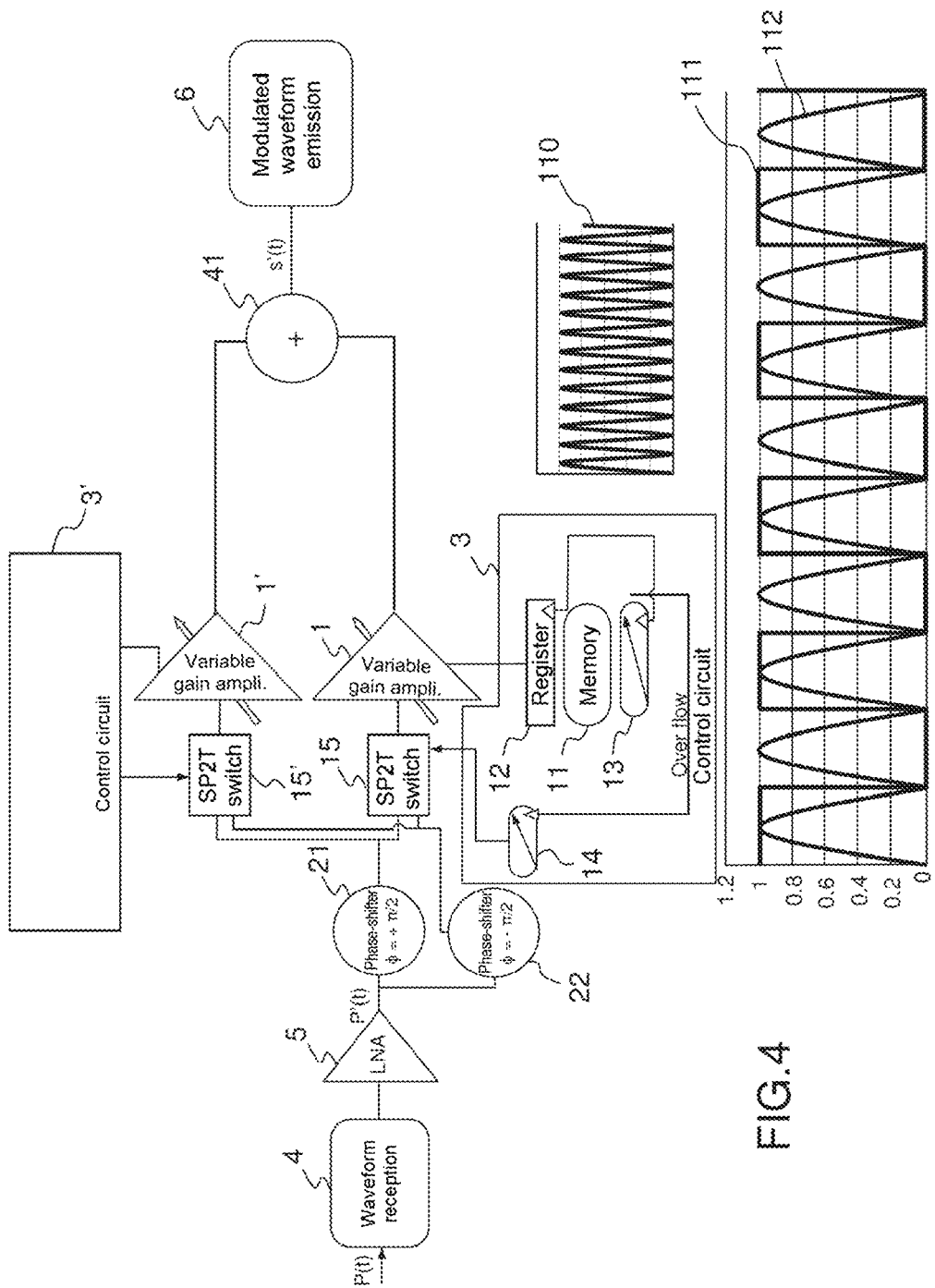
FIG. 4, an example embodiment of a transponder according to the invention performing a double modulation of a received signal.

FIG. 4 illustrates another possible example embodiment of a transponder according to the invention. In this example, the transponder carries out a double modulation.

To carry out this double modulation, starting for example with the configuration of FIG. 3, the control circuit 3, the switch 15 and the variable-gain amplifier 1 are duplicated. In this case, the two inputs of a second switch 15' are connected one to the +π/2 phase-shifter and the other to the −π/2 phase-shifter. The output of this switch 15' is connected to the input of a second variable-gain amplifier. A second control circuit 3', having the same structure and the same function as the control circuit 3 of FIGS. 1 and 3, controls the second switch 15' and the gain of the amplifier as described with reference to those figures.

The outputs of two amplifiers 1, 1' are summed by a circuit 41 in order to deliver the modulated signal s'(t), which is emitted by the amplifying means 6.

Advantageously, the modulation frequency $f_1$ may time hop, and therefore code data, thus allowing a low-cost data link to be achieved. This link may be achieved in a simple configuration or a double-modulation configuration.

Figure 5:
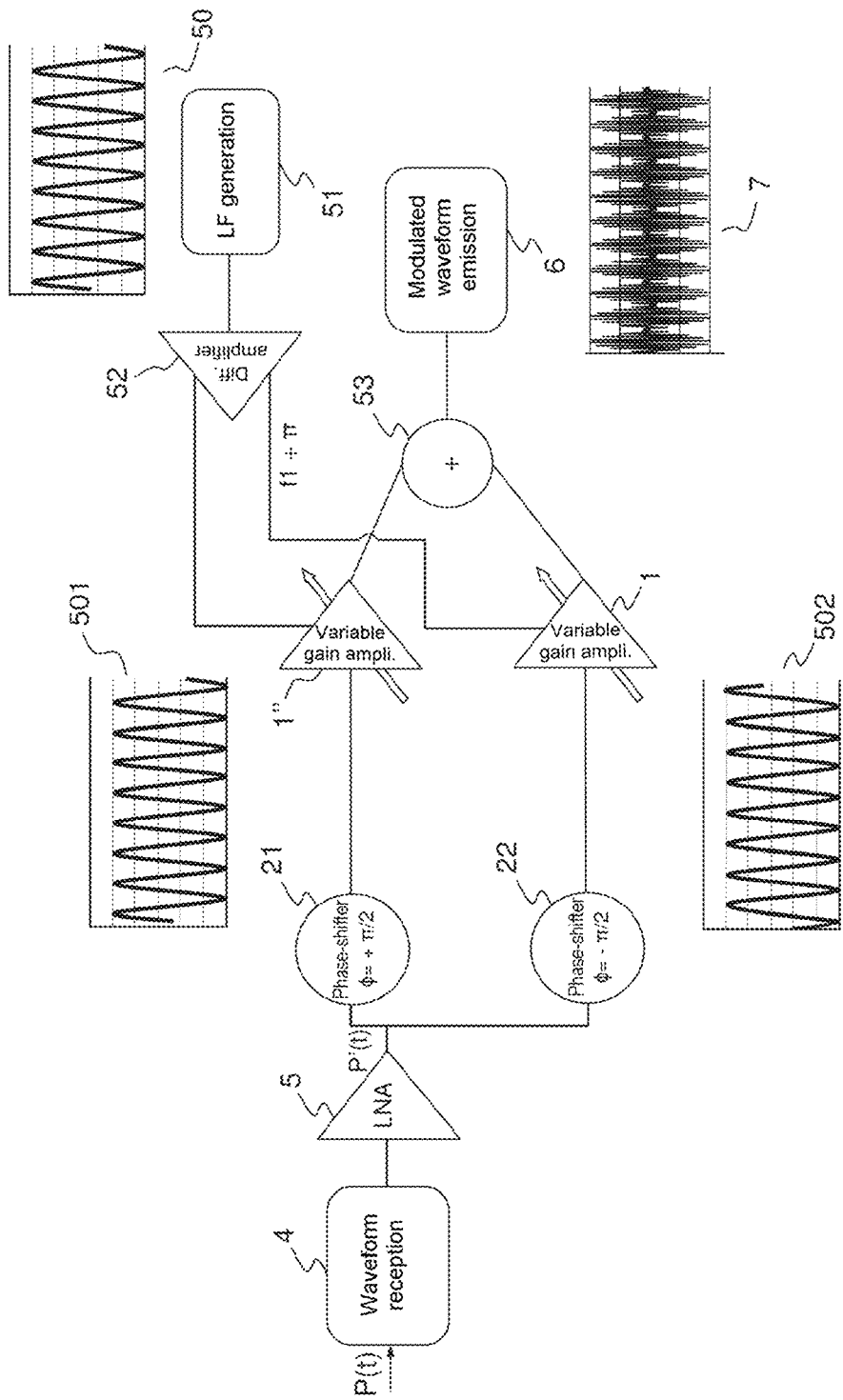
FIG. 5, an example embodiment for another modulation mode performed in a transponder according to the invention.

FIG. 5 illustrates another example embodiment of a transponder according to the invention not using any switches. In this case, the modulation is controlled by a frequency generator 51 and two differential amplifiers represented by a single amplifier 52. In this configuration, a first amplifier is in an inverting configuration and the other is configured in a non-inverting configuration. The sinusoidal signal output from the generator 51 is transmitted:
- to the input of the non-inverting differential amplifier, which transmits this signal to its output;
- and to the input of the inverting amplifier, which transmits this signal inverted, i.e. with a phase shift of π, to its output.

The rejection of the common mode of this arrangement is achieved using known solutions.

The transponder again comprises the receiving circuit 4, the amplifier 5 and the two (+π/2, −π/2) phase-shifters 21, 22 in parallel each followed by one variable-gain amplifier 1, 1". The signals output from the latter are summed 53 then emitted by the emitting means 6.

The frequency generator 51 delivers the modulation frequency $f_1$, which is shown by the curve 50. This modulation signal is of lower frequency, for example equal to 1 kHz. It is delivered as input to the differential amplifier 52, which is composed of two amplifiers, one inverting and one non-inverting. This amplifier 52 delivers as output a first signal 501 at the frequency $f_1$ and a second signal 502 that is inverted, i.e. phase shifted by π. The first sinusoidal signal 501 controls the variable gain of one amplifier 1 and the second sinusoidal signal 502 controls the variable gain of the other amplifier 1".

On output from the low-noise amplifier 5, the received signal P(t) is directed to the two phase-shifters 21, 22. It is phase shifted by +π/2 by the first phase-shifter 21 and by −π/2 by the second phase-shifter 22. The resultant signals thus phase shifted by π enter into the variable-gain amplifiers 1, 1", which are controlled in phase opposition. They are amplified depending on the sinusoids 501, 502 then added by an adder 53. The signal output from this adder is the same signal 7 as that obtained by means of the switch 15 and of the amplifier 1 of the circuit of FIG. 3, in respect of the modulation envelope resulting from the sum of the sinusoids 501, 502.

Figure 6:
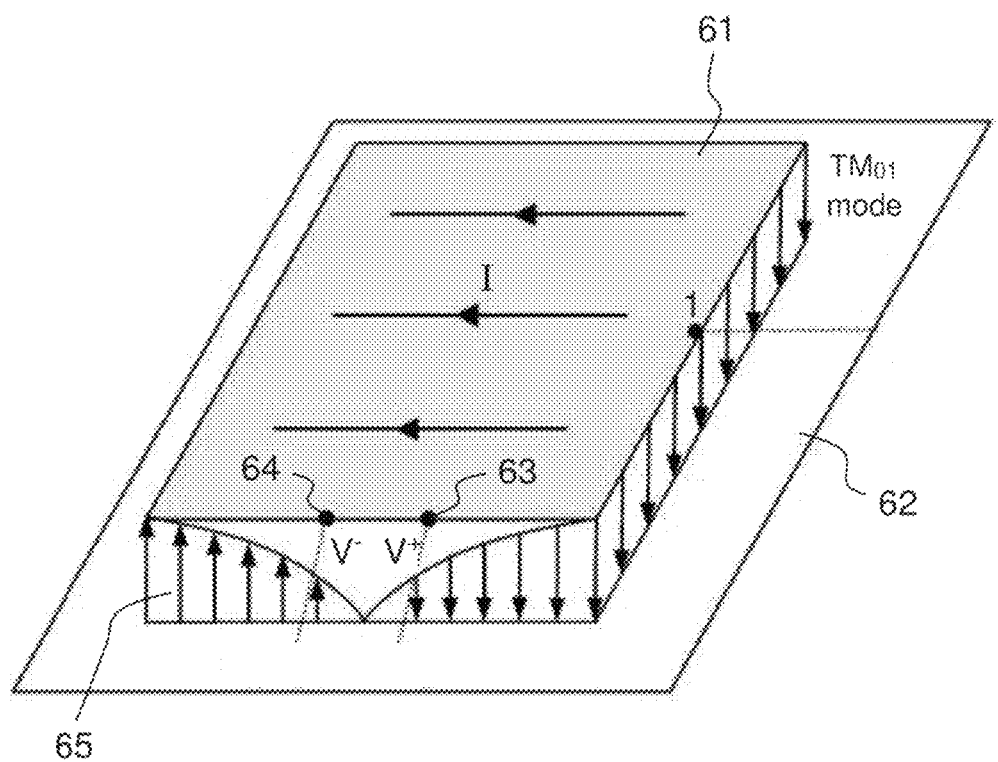
FIG. 6, an example embodiment of phase-shifting circuits used for the modulation.

FIG. 6 illustrates one particular way of achieving the phase shift of the received signal. In this case, advantage is taken of the overall architecture of the transponder, and in particular the structure of the receiving means 4, and more particularly of the receiving antenna. FIG. 6 corresponds to the case where the receiving antenna is an antenna made up of an array of radiating elements, i.e. of patches. FIG. 6 shows one of these radiating elements.

The received signal induces an electromagnetic field 65 between the metallized face 61 of the radiating element and its ground plane 62, which propagates in the $TM_{01}$ mode in the example of FIG. 6. In this configuration, the output ports of the radiating element 63, 64 are one at a voltage V+(t) and the other at a voltage V−(t), which voltages are naturally in phase opposition by the very construction of the radiating element, as the direction of the electromagnetic field 65 illustrates.

Advantageously, the invention uses these output ports 63, 64 to create the phase shift. Such a solution simplifies the architecture of the transponder, because it makes redundant the phase-shifters 21, 22 that generate the +π/2 and −π/2 phase shifts. To this end, with reference for example to the configuration of FIG. 3, the outputs of the port 63, V+(t), of all the radiating elements are connected to the first input of the switch 15, and the outputs of the port 64, V−(t), of all the radiating elements are connected to the second input of the switch. With reference to FIG. 5, the connections will be made to the first variable-gain amplifier 1 and to the second variable-gain amplifier 1".

This solution also has the advantage of there permanently being a constant phase shift of π between the outputs, whatever the frequency of the received signal. This is not the case with phase-shifters, which are rarely perfect over a wide frequency band.

Advantageously, a responder beacon may be equipped with a transponder such as described in the embodiments above. Such a beacon may be produced at low cost by virtue of the use of this transponder. It is also advantageously possible to make frequency-shifted lines appear very close to the received signal, without the carrier, for example at 1 kHz from a signal received at 10 GHz.

Figure 7:
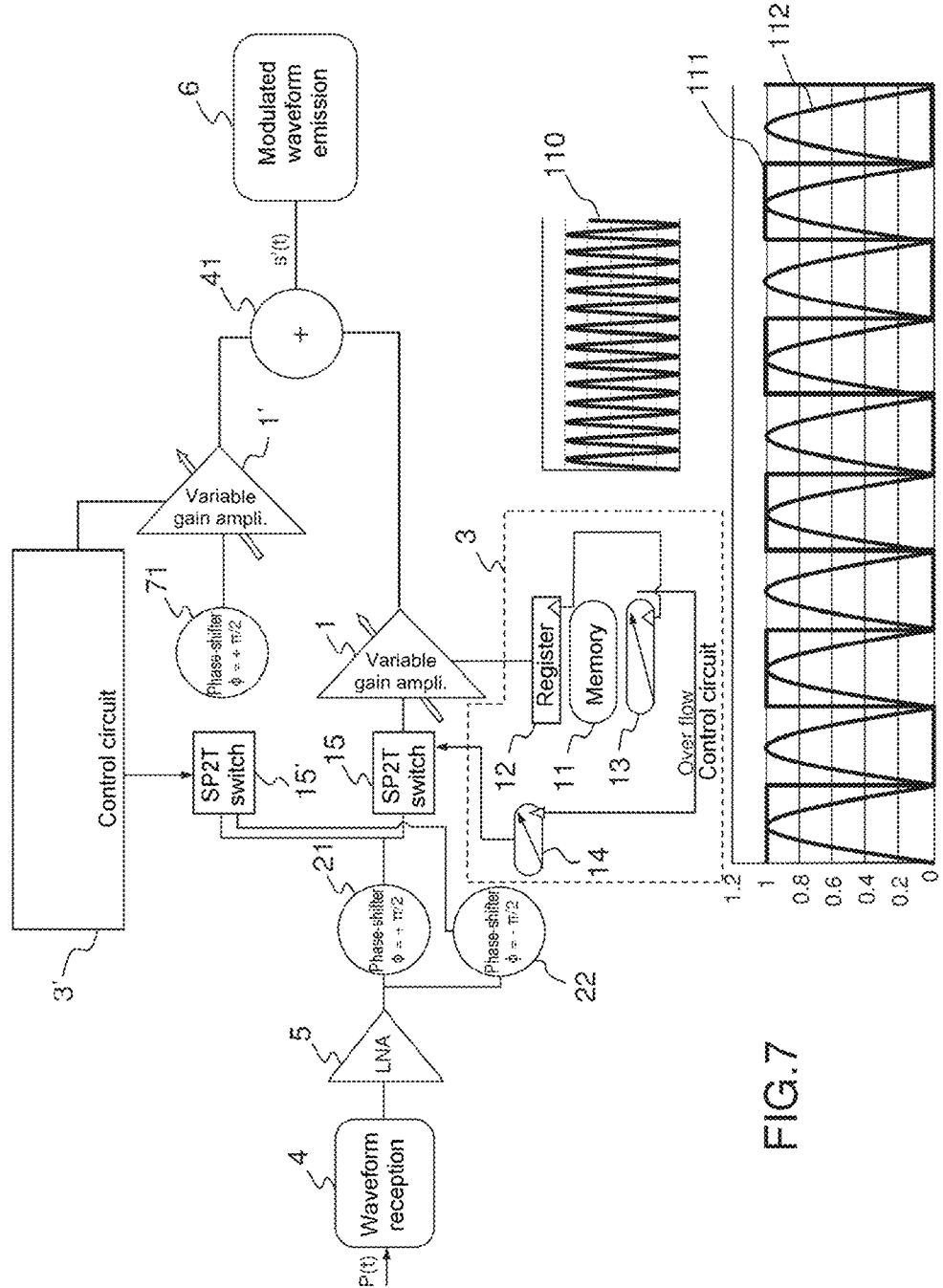
FIG. 7, an example of application of a modulation according to the invention to an SSB (single-sideband) emission.

FIG. 7 illustrates an example embodiment of a single-sideband (SSB) device, based on the example embodiment of FIG. 4. An SSB modulation is an amplitude modulation in which the carrier and one of the sidebands are suppressed.

The solution according to the invention, which suppresses the carrier, advantageously allows an SSB modulation to be carried out.

In the prior art, SSB devices use filtering and a non-linear amplitude modulator that generates harmonics.

Specifically, what is conventionally sought with an SSB modulator is to obtain:

$V(t) = U \cdot S \cdot \cos(2\pi(f_1+f_2) \cdot t)$ (upper SSB) or
$V(t) = U \cdot S \cdot \cos(2\pi(f_1-f_2) \cdot t)$ (lower SSB) from:

$s(t) = S \cdot \cos(2 \pi \cdot f_1 \cdot t)$ on a first input of the modulator; and $u(t) = U \cdot \cos(2 \pi \cdot f_2 \cdot t)$ on a second input of the modulator.

This way of proceeding requires filtering and a non-linear modulator that generates harmonics.

Knowing that:

$\cos(a+b) = \cos a \cos b - \sin a \sin b$ (obtains the upper SSB);

$\cos(a-b) = \cos a \cos b + \sin a \sin b$ (obtains the lower SSB);

$\sin(a+\pi/2) = \cos(a)$;

$\cos(-a) = \cos(a)$;

$\sin(-a) = -\sin(a)$.

The upper SSB and the lower SSB are obtained; in particular from:

$$\sin(a)\cdot\sin(b)+\cos(a)\cdot\cos(b)=\cos(a-b) \text{ for the lower SSB.}$$

For the upper SSB, it is necessary to implement:

$$\sin(a)\cdot\sin(b)-\cos(a)\cdot\cos(b)=-\cos(a+b)$$

For the lower SSB, denoted $S_{blu}(t)$, and reusing the above notations, $V(t)=S_{blu}(t)$ is equal to:

$$K\cdot\cos(2\pi\cdot f_1\cdot t+2\pi\cdot f_2\cdot t)=K\cdot(\cos(2\pi\cdot f_1\cdot t)\cdot\cos(2\pi\cdot f_2\cdot t)+\sin(2\pi\cdot f_1\cdot t)\cdot\sin(2\pi f_2\cdot t).$$

The first modulation channel of the circuit of FIG. 4, which circuit is composed of the two modulators 21, 22, of the first switch 15 and of the first variable-gain amplifier 1 allows the sine-product term, i.e. $\sin(2\pi\cdot f_1\cdot t)\cdot\sin(2\pi\cdot f_2\cdot t)$, to be determined.

Advantageously, the second modulation channel is used to determine the cosine product, i.e. $\cos(2\pi\cdot f_1\cdot t)\cdot\cos(2\pi\cdot f_2\cdot t)$.

Specifically, knowing that:

$$\cos(2\pi\cdot f_2\cdot t)=\sin(2\pi\cdot f_2\cdot t+\pi/2) \text{ and that}$$
$$\cos(2\pi\cdot f_1\cdot t)=\sin(2\pi\cdot f_1\cdot t+\pi/2),$$

the implementation for this function becomes similar to the preceding one, if a phase shift of $\pi/2$ is introduced into the second modulation channel.

Thus, starting with the configuration of FIG. 4, a phase-shifter 71 is added to the second modulation channel, for example between the second switch 15' and the second variable-gain amplifier 1'. This additional phase-shifter applies a phase shift of $+\pi/2$.

The signal output from the adder 41 forms the SSB-modulated signal.

As the example embodiments described above show, the invention advantageously allows a sinusoidal modulation to be emitted while removing the carrier, without generating harmonics and without using any filters. It also makes it possible to obtain modulations very close to the carrier.

Another advantage is the ability to greatly miniaturize the modulating device, and thus decrease the bulk of a beacon incorporating it and its cost.

The invention also advantageously allows a multifrequency modulation to be performed, this modulation possibly being used for a telecommunication application. Specifically, it is possible to use the same control circuit to control two, or even more than two, frequency-translation functions, and therefore to use this means to transmit data.

The invention claimed is:

1. A device for modulating a microwave signal, wherein it comprises at least:
a circuit for generating a rectified sinusoidal signal;
a phase-shifting circuit able to receive as input said microwave signal comprising:
  a first channel applying a given phase shift;
  a second channel applying said given phase shift increased by $\pi$;
a variable-gain amplifier the gain of which is controlled by said rectified sinusoidal signal;
a switch controlled by said rectified sinusoidal signal, able to alternatively switch said first channel and said second channel to the input of said amplifier, the switch from one channel to the next being performed on each passage through 0 of said rectified sinusoidal signal, the output signal of said amplifier being the modulated microwave signal.

2. The device as claimed in claim 1, wherein it comprises:
a second circuit for generating a rectified sinusoidal signal;
a second variable-gain amplifier the gain of which is controlled by said rectified sinusoidal signal generated by said second circuit;
a second switch controlled by said rectified sinusoidal signal, able to alternatively switch said first channel and said second channel to the input of said second amplifier, the switch from one channel to the next being performed on each passage through 0 of said rectified sinusoidal signal;
an adder that sums the signal output from said first amplifier and the signal output from said second amplifier;
the signal output from said adder, resulting from the summation of said output signals, being the modulated signal.

3. The device as claimed in claim 2, wherein it comprises a phase-shifter between said second switch and said second variable-gain amplifier, said phase-shifter applying a phase shift of $+\pi/2$, said modulated signal being single-sideband modulated.

4. The device as claimed in claim 1, wherein said given phase shift is zero.

5. The device as claimed in claim 4, wherein said first channel connects the input of said phase-shifting circuit to a first input of said switch, said second channel comprising a phase-shifter that applies a phase shift of $\pi$ and that is connected between said input and a second input of said switch.

6. The device as claimed in claim 1, wherein said given phase shift is equal to $-\pi/2$.

7. The device as claimed in claim 6, wherein:
said first channel comprises a first phase-shifter that applies a phase shift of $-\pi/2$ and that is connected between the input of said phase-shifting circuit and a first input of said switch;
said second channel comprises a second phase-shifter that applies a phase shift of $+\pi/2$ and that is connected between said input and a second input of said switch.

8. A transponder, wherein it comprises at least:
receiving means able to receive a microwave signal;
a modulating device as claimed in claim 1, that modulates the signal output from said receiving circuit;
emitting means that are able to emit the modulated signal output from said modulating device.

9. The transponder as claimed in claim 8, wherein said receiving means comprising an antenna composed of an array of radiating elements, said phase shift of $\pi$ between said first channel and said second channel is obtained in the radiating elements between the positive polarity and the negative polarity of each radiating element, the first channel being connected to all of the positive polarities and the second channel being connected to all of the negative polarities.

10. A responder beacon, wherein it is equipped with a transponder as claimed in claim 8.

11. The responder beacon as claimed in claim 10, wherein said rectified sinusoid or said sinusoidal signals are substantially at the frequency of 1 kHz.

12. A device for modulating a microwave signal wherein it comprises at least:
a circuit for generating a first sinusoidal signal and a second sinusoidal signal that is phase shifted by $\pi$ with respect to said first signal;
a first channel, able to receive as input said microwave frequency signal, comprising a first phase-shifter that applies a given phase shift and a first variable-gain amplifier the gain of which is controlled by said first sinusoidal signal;

a second channel, able to receive as input said microwave frequency signal, comprising a second phase-shifter that applies said given phase shift increased by $\pi$ and a second variable-gain amplifier the gain of which is controlled by said second sinusoidal signal;

an adder that sums the signal output from said first amplifier and the signal output from said second amplifier;

the signal output from said adder, resulting from the summation of said output signals, being the modulated signal.

13. The device as claimed in claim 12, wherein said given phase shift is zero.

14. The device as claimed in claim 12, wherein said given phase shift is equal to $-\pi/2$.

15. The device as claimed in claim 12, wherein said generating circuit comprises at least a low-frequency generator that delivers said sinusoidal signal and a circuit containing a differential amplifier that, on the one hand, reproduces said sinusoidal signal in order to form said first sinusoidal signal and that, on the other hand, delivers a sinusoidal signal that is phase-shifted by $\pi$ with respect to said sinusoidal signal in order to form said second sinusoidal signal.

* * * * *